United States Patent
Kang

(10) Patent No.: US 6,930,357 B2
(45) Date of Patent: Aug. 16, 2005

(54) ACTIVE SOI STRUCTURE WITH A BODY CONTACT THROUGH AN INSULATOR

(75) Inventor: Woo-Tag Kang, Apex, NC (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/463,023

(22) Filed: Jun. 16, 2003

(65) Prior Publication Data

US 2004/0253773 A1 Dec. 16, 2004

(51) Int. Cl.$^7$ .......................................... H01L 31/0392
(52) U.S. Cl. ..................... 257/347; 257/349; 257/351
(58) Field of Search ................................ 257/347, 349, 257/351, 301

(56) References Cited

U.S. PATENT DOCUMENTS

| | | | | |
|---|---|---|---|---|
| 4,763,183 A | * | 8/1988 | Ng et al. .................... | 257/288 |
| 4,969,022 A | * | 11/1990 | Nishimoto et al. ......... | 257/301 |
| 5,593,912 A | | 1/1997 | Rajeevakumar | |
| 5,606,188 A | | 2/1997 | Bronner et al. | |
| 6,174,754 B1 | * | 1/2001 | Lee et al. ................... | 438/142 |
| 6,245,663 B1 | * | 6/2001 | Zhao et al. ................. | 438/622 |
| 6,284,594 B1 | | 9/2001 | Ju et al. | |
| 6,407,427 B1 | * | 6/2002 | Oh ............................. | 257/347 |
| 6,429,099 B1 | | 8/2002 | Christensen et al. | |
| 6,664,150 B2 | * | 12/2003 | Clark et al. ................. | 438/154 |
| 2002/0163041 A1 | | 11/2002 | Kim | |
| 2003/0134231 A1 | * | 7/2003 | Tsai et al. ................... | 430/312 |

FOREIGN PATENT DOCUMENTS

| | | |
|---|---|---|
| JP | 09-283766 | 10/1997 |
| WO | WO 01/43198 A2 | 6/2001 |

OTHER PUBLICATIONS

Coping with the floating-body effect in SOI DRAM, Troy Robinson and Alejandro Flores; pp 1–2; http://kabuki.-eecs.berkeley.edu/~troyr/class/paper/-mid_proposal.html.

SOI Technology: IMB's Next Advance in Chip Design; www-3.ibm.com/chips/bluelogic/showcase/soi/soi-paper.pdf.

Floating Body Effects for Design Engineers or The New Design Frontier, Ted Houston, Texas Instruments; May 25, 2000; engr.smu.edu/orgs/cas/documents/soi_ieee.ppt.

DRAM Technology for Today's Market and Future DRAM Generations; W. Neumueller, J. Alsmeier, G. Bronner, S. Ishibashi, H. Klose; www.essderc.org/papers—97/315.pdf.

* cited by examiner

Primary Examiner—George Fourson
Assistant Examiner—Thanh V. Pham
(74) Attorney, Agent, or Firm—Slater & Matsil, L.L.P.

(57) ABSTRACT

A silicon on insulator shaped structure formed to reduce floating body effect comprises a T-shaped active structure and a body contact for back bias. Etching a T-shape through two layers of oxide will form the T-shaped active areas. A back bias is formed when a metal line is dropped through the SOI structure and reaches a contact plug. This contact plug is doped with N+ or P+ dopant and is embedded in a Si substrate. The T-active shaped structure is used to reduce the short channel effects and junction capacitance that normally hinder the effectiveness of bulk transistors. The back bias is used as a conduit for generated holes to leave the SOI transistor area thus greatly reducing the floating effects generally associated with SOI structures.

13 Claims, 6 Drawing Sheets

ACTIVE SOI STRUCTURE WITH A BODY CONTACT THROUGH AN INSULATOR

FIELD OF THE INVENTION

The present invention relates generally to field effect transistors and, in particular, to field effect transistors with silicon on insulator ("SOI") structures.

BACKGROUND

Over time, SOI has become a popular design in field effect transistor ("FET") technology. In prior years, the FET's large junction capacitance hindered its performance. For example, in NMOS transistors where doped N regions are embedded in silicon P substrates, depletion regions form in the substrate. These depletion regions are located at each area between the P and N regions (called a PN junction) and are characterized by a depleted number of majority carriers. Consequently, depletion regions must be charged with majority carriers before the NMOS can properly work. Recharging the depletion region with majority carriers can take so long that the time to charge the depletion region exceeds the time to switch the NMOS to the desired voltage. SOI rectifies this problem because it places a sheet of insulation between the P and N regions, thus eliminating the large depletion region and junction capacitance. Compared to a regular bulk transistor, SOI is advantageous to the extent it has low junction leakage, junction capacitance, and power consumption.

Nevertheless, SOI also has disadvantages. One drawback to the SOI structure is the floating body effect, which can degrade current flow. The floating body effect occurs when, at NMOS operation, electrons in the source terminal are drawn to a high electric field in the drain terminal and experience impact ionization. Impact ionization occurs when high speed carriers, like electrons, collide with atoms in a semiconductor lattice, like atoms in a drain. The impact ionization creates electron-hole pairs in the drain region. The low potential active Si bottom region draws these generated holes towards its bottom region. In a bulk transistor, the holes collecting at the Si bottom region exit through a low potential body contact. But, in an SOI structure, insulator separates the active Si region from the body. Therefore, without any body contact, generated holes collect at the active Si bottom and increase the potential of the active Si bottom. This creates a forward-bias between the source and the active Si bottom. As a result of the forward bias, electron injection occurs from the source to the active Si bottom. This, in turn, creates a parasitic NPN bipolar transistor junction, which lowers the threshold voltage and drain breakdown voltage of the NMOS.

An unmet need therefore exists for creating a body contact in a SOI structure that is useable as an exit for generated holes.

SUMMARY OF THE INVENTION

Structures according to the present invention provide a solution to the problems described above by combining an SOI structure with a body contact able to flush out generated holes collecting at the Si bottom region.

In one embodiment according to the present invention, a method is provided for fabricating an SOI active structure on a wafer in an integrated circuit where an interruption is formed in the insulator and silicon is deposited in the interruption.

Another embodiment according to the present invention provides for an SOI active structure on a wafer in an integrated circuit in which an interruption is formed in the insulator and a body contact is coupled to the insulator and is in communication with the interruption.

In yet another embodiment according to the present invention, an SOI active structure on a wafer in an integrated circuit has an SOI T-shaped structure. It also provides a means for producing a back bias formed in the SOI T-shaped structure in which extra generated holes may exit a transistor.

Another embodiment according to the present invention provides for a transistor in an integrated circuit having a SOI structure with a gate, a source, and a drain. The drain is in communication with the source via a channel. The insulator has an interruption adjacent the channel through which excess change can be conducted away from the channel.

DETAILED DESCRIPTION

Figure 1:
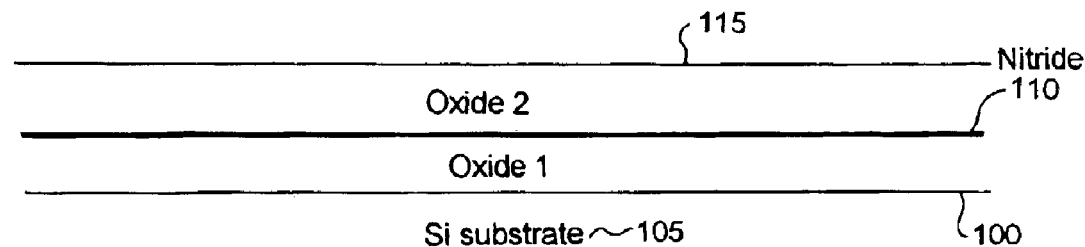
FIG. 1 is a diagram showing nitride and oxide layers deposited on a wafer to form an intermediate structure in an embodiment of the present invention.

FIG. 1 shows a first step in an embodiment of a method, and an intermediate IC structure, according to the present invention. This and the subsequently related steps describe one embodiment of a method for creating an SOI-shaped structure according to the present invention. A first layer of oxide 100 is deposited over a Si substrate 105. In this example, but without limitation, the thickness of oxide layer 100 is 1000 Å. After the first oxide layer is set, a layer of nitride ("SiN") 110 having, in this example, but without limitation, a width of 100 Å is deposited over oxide layer 100. Acting as a stopping liner, SiN layer 110 stops the oxide etch process and prevents it from reaching material underneath SiN 110. SiN 110 permits formation of a vertical T-shaped SOI structure in this embodiment. In a final step of FIG. 1, a second layer of oxide 115, in this embodiment having with a width of 1000 Å, is deposited over the nitride layer.

Figure 2:
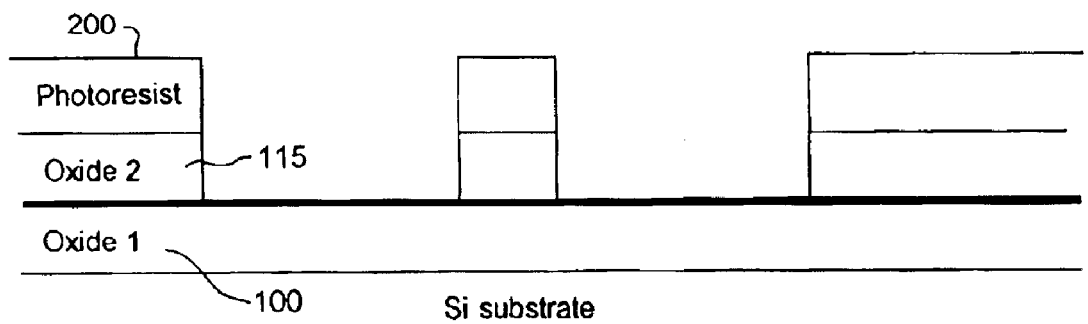
FIG. 2 is a diagram showing photoresist deposited over the intermediate structure of FIG. 1, and also showing the photoresist having been etched to form a further intermediate structure, in an embodiment of the present invention.

FIG. 2 shows the intermediate structure of FIG. 1, where that intermediate structure has been etched. Photoresist 200 is deposited over oxide layer 115, after which active photolithography, as known in the art, is used to etch holes in photoresist 200. Photolithography, as known in the art, is used to create openings in the photoresist that can eventually be used for Si epitaxial growth, for example. An oxide etch is then performed to etch away any oxide not underneath the photoresist. As described above, the oxide etch cannot penetrate SiN layer 110; thus only oxide layer 115 is etched. Oxide layer 100, located underneath nitride layer 110, remains unaffected.

Figure 3:
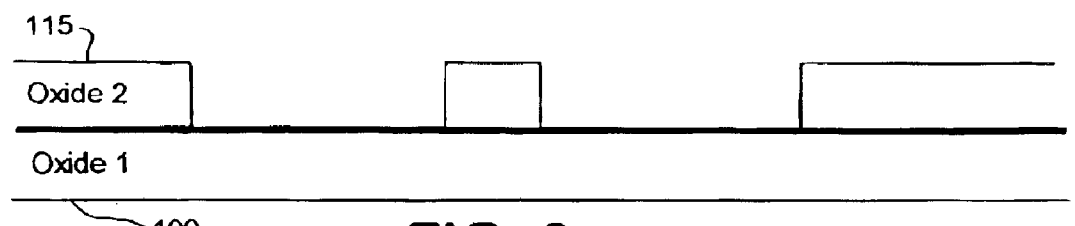
FIG. 3 is a diagram showing the intermediate structure of FIG. 2, having been further etched, to produce another intermediate structure, in an embodiment of the present invention.

FIG. 3 is a diagram showing the intermediate structure of FIG. 2 following further etching. Photoresist layer 200 has been etched completely away, leaving behind a patterned oxide layer 115. Photoresist can be removed by use of a so-called ashing process.

Figure 4:
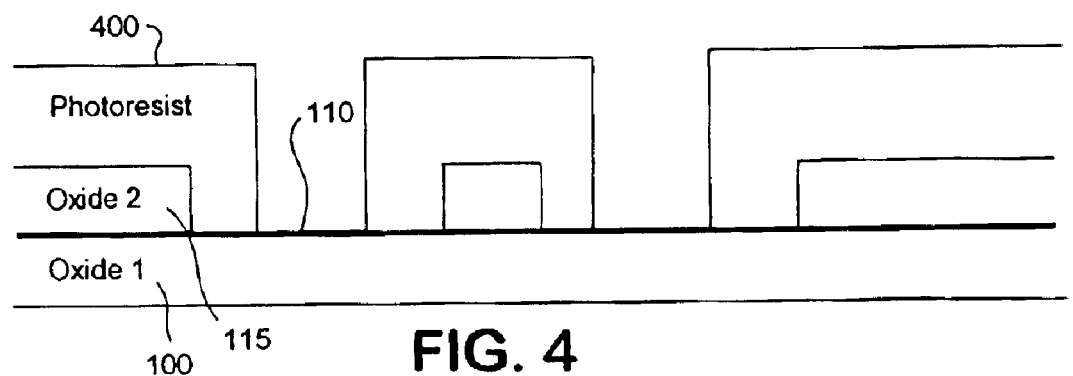
FIG. 4 is a diagram showing photoresist deposited over the intermediate structure of FIG. 3, a further etch of the deposited photoresist, and a further intermediate structure, in an embodiment of the present invention.

In FIG. 4, a layer of photoresist 400 has been deposited over the intermediate structure of FIG. 3. Openings in photoresist 400 have been created by a photolithographic step, leaving areas of SiN layer 110 exposed.

Figure 5:
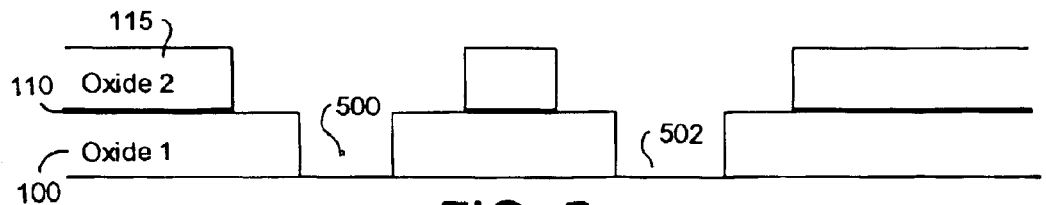
FIG. 5 is a diagram showing the intermediate structure of FIG. 4 having been further etched, to produce another intermediate structure, in an embodiment of the present invention.

FIG. 5 shows the intermediate structure of FIG. 4 where that intermediate structure has been etched. A nitride etch is performed on the nitride 110 layer exposed by the procedure of FIG. 4, leaving portions of oxide layer 100 exposed. Oxide etching is then performed to etch that portion of oxide layer 100 that is exposed. No other layer is affected, because photoresist 400 blocks the oxide etch from reaching materials located underneath photoresist 400. Ashing processes are then performed on photoresist 400 to remove the remaining photoresist. Following the ashing process, a nitride etch is performed to remove any portion of nitride layer 110 exposed after photoresist 400 is removed. After the nitride etch, clean active T-shaped areas 500 and 502, according to an aspect of the present invention, remain in the wafer.

Figure 6:
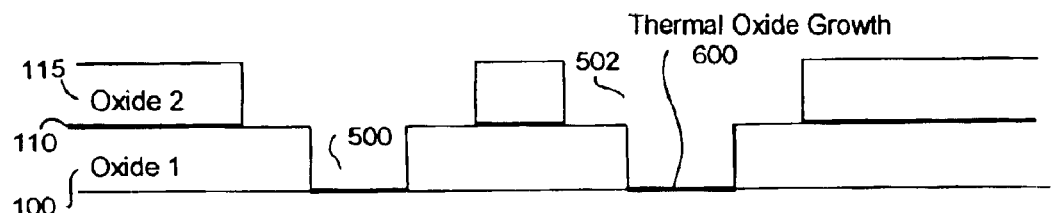
FIG. 6 shows an oxidation over the intermediate structure in FIG. 5, and a further intermediate structure in an embodiment of the present invention.

Referring to FIG. 6, a thermal oxidization (not deposition) step is performed according to known methods. The T-shaped holes or interruptions 500, 502 will eventually be filled with Si-epitaxy; however, for Si epitaxial growth, a clean and damage-free surface is preferred. It is possible that, while etching oxide layer 100, the oxide etch could damage the surface at the bottom of the T-shaped interruptions 500, 502. To properly cure the Si surface at the bottom of oxide layer 100, thermal oxidation of the surface may be performed, followed by removal of the resulting thin thermal oxide 600. Thin thermal oxide 600, in this example, but without limitation is about 100 Å wide.

Figure 7:
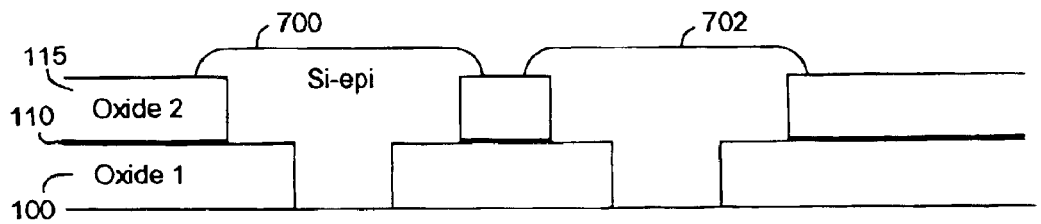
FIG. 7 shows Si growth over the intermediate structure of FIG. 6, and a further intermediate structure in an embodiment of the present invention.

FIG. 7 shows Si epitaxy regions grown over the T-shaped interruptions 500, 502 in FIG. 6 to form T-shaped transistor structures 700, 702.

Structures formed using Si epitaxy may grow in an uneven manner. Thus, in FIG. 8, chemical mechanical polishing ("CMP") or other suitable methods may be used to even out any non-even portions of structures 700, 702 from the intermediate structure shown in and described with reference to FIG. 7. CMP processes ensure a smooth and even Si surface. After structures 700, 702, are smoothed and evened, a thermal oxidation step is performed over the Si epitaxy. The thermal oxidation forms oxide layers 800, 802, which, in this example, but without limitation, are about 100 Å in thickness. This oxidation is used to cure Si surface damage which can occur during the CMP process.

Figure 8:
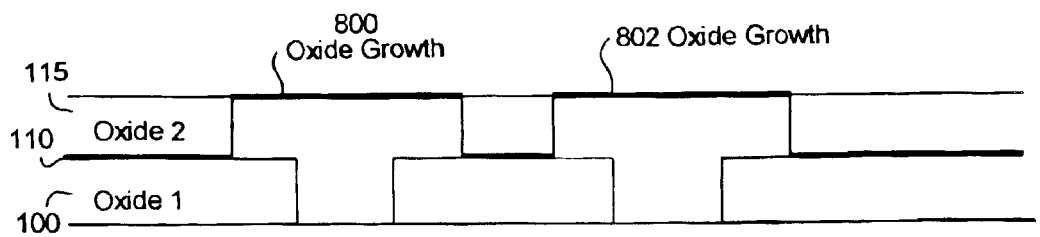
FIG. 8 is a diagram showing a smoothing of the intermediate structure of FIG. 7, an oxidation of the intermediate structure of FIG. 7, and a further intermediate structure in an embodiment of the present invention.
Figure 9:
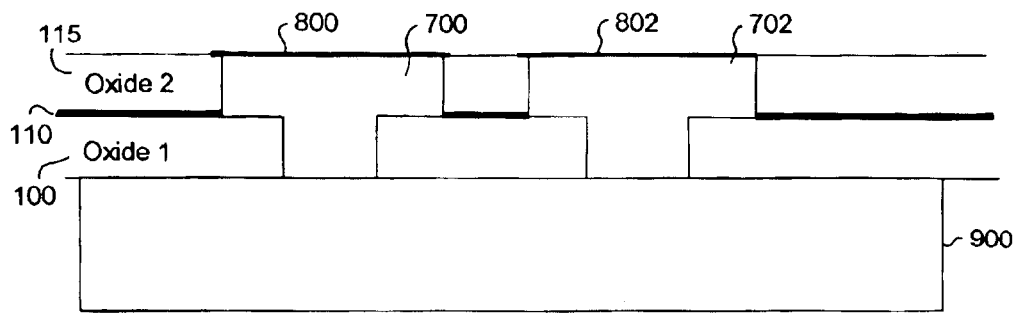
FIG. 9 is a diagram showing an implantation of a well in the intermediate structure of FIG. 8, and a further intermediate structure in an embodiment of the present invention.

Referring to FIG. 9, after the CMP and oxide processes shown in FIG. 8, a well 900 is implanted into substrate 105 (not shown). Well 900 is used for CMOS processes, for example, to have NFET and PFET isolation. For a PFET, an N well is used; whereas for an NFET, a P well is used.

Figure 10:
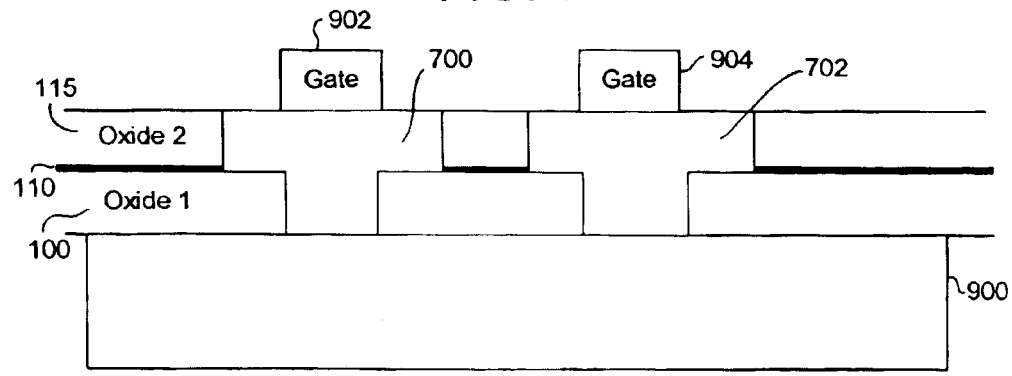
FIG. 10 shows formation of a gate over the intermediate structure of FIG. 9, and a further intermediate structure in an embodiment of the present invention.

To form a transistor, a gate is placed over the T-shaped structures. Therefore, in the illustrated embodiment, as shown in FIG. 10, gates 902, 904 are formed according to known methods, over the T-shaped structures 700, 702.

Figure 11:
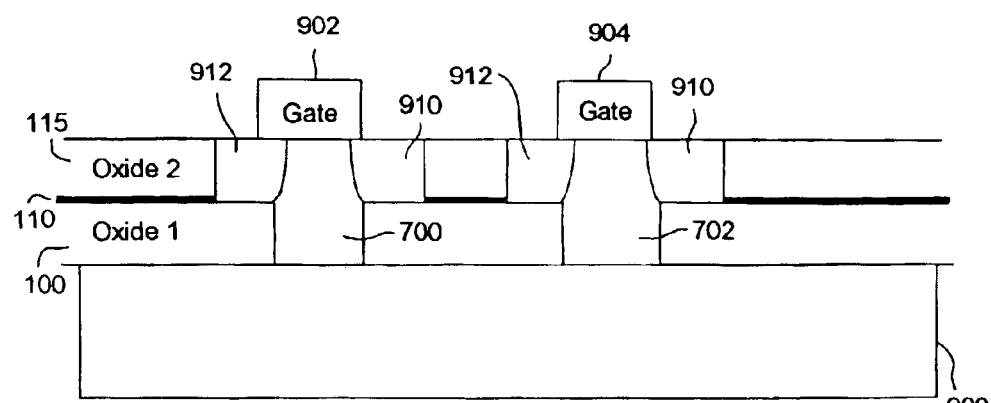
FIG. 11 shows implantation of a source or drain in the intermediate structure of FIG. 10, and a further intermediate structure in an embodiment of the present invention.

Turning to FIG. 11, sources and drains 910, 912 (or vice versa) are formed, according to known methods, e.g., by implantation on either side adjacent to gates 902, 904. With the implantation of a source and a drain, e.g., 910, 912, T-shaped transistor structures 700, 702 are formed according to the present invention.

Figure 12:
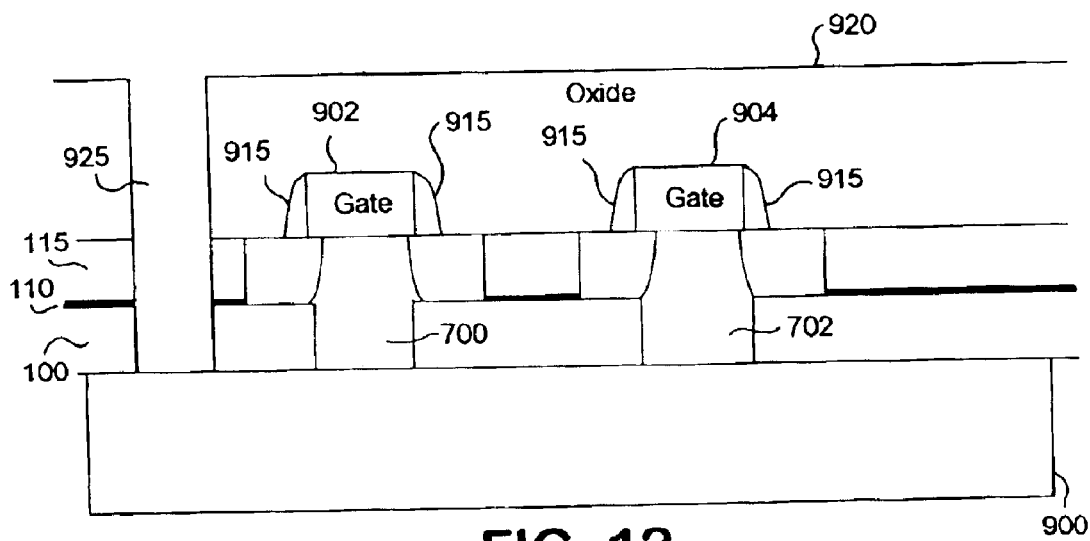
FIG. 12 is a diagram showing formation of gate spacer and dielectric, deposition of oxide over the gate structure, and formation of a body contact in the intermediate structure of FIG. 11, and a further intermediate structure, in an embodiment of the present invention.

FIG. 12 shows the formation of gate spacer layers 915 and dielectric layers in the illustrated embodiment. Lightly doped drains ("LDD") are used in many transistors because LDDs reduce transistors' short channel effects. Nevertheless, LDDs of separate transistors should be electrically isolated from each other. Gate spacers 915 electrically isolate separate LDDs from each other. A third layer of oxide 920 is then deposited over the transistors with gate spacer and dielectric layers.

According to an aspect of the present invention, a back bias is created in order to remove extra holes that collect at the bottom of T-shaped structure 500, 502. Therefore, as shown in FIG. 12, body contact 925 is formed, extending to Si substrate 105 (as shown in FIG. 1). To form body contact 925, a layer of photoresist is first deposited over oxide layer 920. Photolithography, as known in the art, is then used to open a hole in the photoresist. A dry oxide etch is applied to oxide layer 920, etching out any portion of oxide layer 920 and oxide layer 115 not underneath the photoresist. The nitride stopper layer 110 is then etched, followed by an oxide etch of oxide layer 100, yielding body contact 925 that reaches Si substrate 105 (as shown in FIG. 1).

Figure 13:
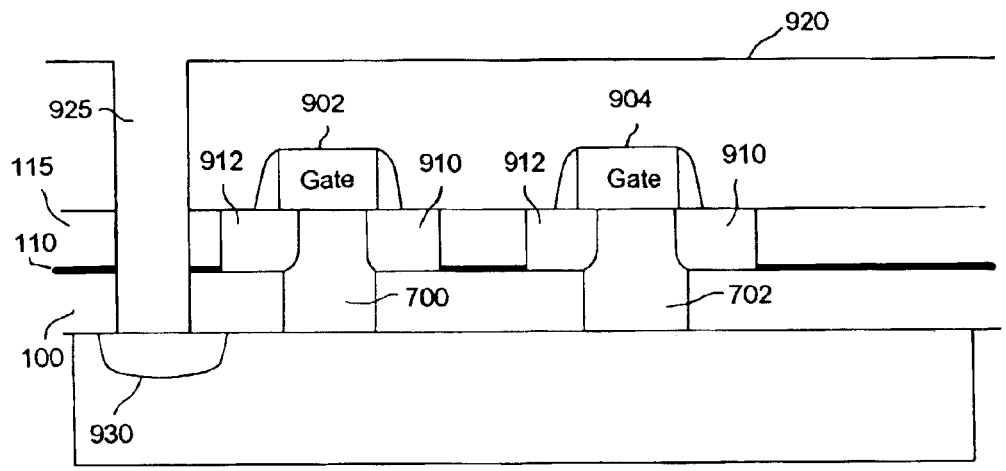
FIG. 13 is a diagram showing implantation of a contact plug in the intermediate structure of FIG. 12, and a further intermediate structure in an embodiment of the present invention.

In FIG. 13, contact plug 930 is implanted, as shown. Contact plug 930 is implanted with N+ dopant for an N well and P+ dopant for a P well. Thermally generated holes in the drains (910 or 912) exit through contact plug 930, thus addressing, and preferably alleviating, the floating body effect.

Figure 14:
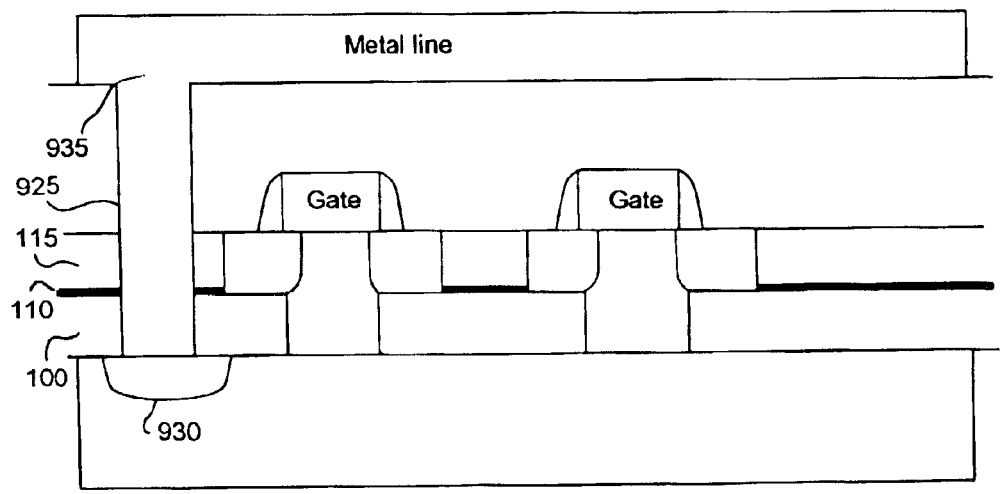
FIG. 14 is a diagram showing deposition of metal in the intermediate structure of FIG. 13 to produce a back bias in an embodiment of the present invention.

FIG. 14 shows a process for completing body contact 925 in an embodiment of the invention, in which a conductor, such as metal line 935, is deposited to complete body contact 925. Also, metal line 935 may be deposited over oxide layer 920. Metal line 935, which forms body contact 925 and contact plug 930, in this embodiment, is inside the N+ or P+ region, leading to lower contact leakage current.

Figure 15:
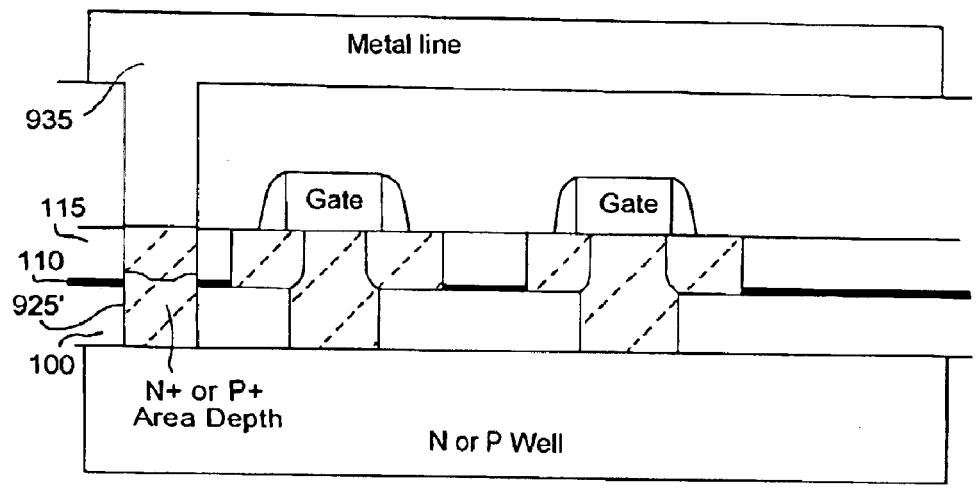
FIG. 15 shows another embodiment of the present invention.

In another embodiment of this aspect of the present invention, formation of an "easy" body contact is shown in FIG. 15. In FIG. 14, the contact plug 930 was deep in the body contact and, therefore, a contact plug implantation was needed. But the embodiment shown in FIG. 15 has a contact plug that is shallow. A contact plug implantation is thus not necessary, since the N+ or P+ contact plug implantation is simultaneously formed during the N+ or P+ source/drain implantation. Instead, Si is grown, for example using epitaxy, in body contact 925'. Furthermore, in a preceding formation step analogous to the one in FIG. 2, where the T shaped structures are initially formed, an additional hole is formed, as shown in FIG. 15. A process analogous to the process shown in FIGS. 3 through 9 is carried out, and a lower portion of body contact 925' is formed with Si as shown in FIG. 15, for example through epitaxy processes, and an upper portion of a body contact 925' is also formed with a conductor, such as metal line 935, in a process analogous to that shown in FIGS. 10 to 14. For contact plug implantation, the additional hole in the Si surface in FIG. 15 is implanted with N+ or P+ when the N+ or P+ source/drain implantation is formed after the gate process. This additional Si epitaxial hole process reduces the contact plug implantation step and makes an easy contact process due to the shallow contact hole.

Figure 16:
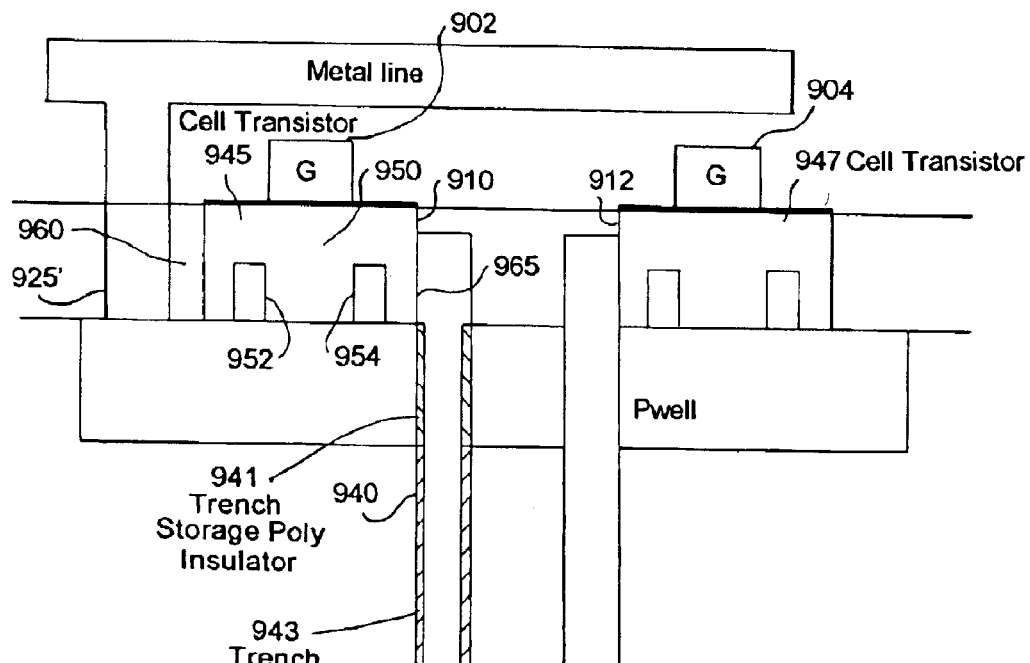
FIG. 16 is a diagram showing an alternative embodiment of the present invention.

FIG. 16 shows another embodiment according to the present invention. In this embodiment, both an easy body contact 925' and a trench capacitor storage poly 940 are used. Storage poly 940 has a trench storage poly insulator 941 and a trench capacitor oxide 943. The top of the storage poly 940 is attached to a transistor source or drain region 910, 912. To achieve good contact attachment between the N type source/drain 910, 912 of the cell transistor 945, 947 and a N+ storage poly 940, the top of trench capacitor storage poly 940 has a high concentration of N-type dopant. This high concentration of N-type dopant degrades the cell transistor's short channel effects because of N-dopant source/drain depletion region increase by the lateral diffusion of N-dopant from the attached high N-dopant trench storage poly region 965 to channel center region 950. In this embodiment according to the present invention, the N-dopant diffusion is reduced since an oxide region 952, 954 blocks N-dopant diffusion from the attached high N-dopant trench capacitor region 965. Therefore, the short channel effects are greatly improved.

While the invention has been particularly shown and described with reference to particular embodiments, those skilled in the art will understand that various changes in form and details may be made without departing form the spirit and scope of the invention as set forth in the appended claims.

What is claimed is:

1. A transistor in an integrated circuit having a silicon on insulator active structure, comprising:
    a silicon substrate;
    an insulator overlying the silicon substrate;
    an epitaxially gown silicon layer extending through a first interruption in the insulator and physically touching the silicon substrate;
    a gate overlying the epitaxially grown silicon layer;
    a source disposed within the epitaxially grown silicon layer;
    a drain disposed within the epitaxially grown silicon layer and in electrical communication with the source via a channel, the channel disposed within the epitaxially grown silicon layer and underlying the gate, wherein the first interruption is located adjacent the channel such that excess charge can be conducted away from the channel to the silicon substrate;
    a body contact, in electrical communication with the first interruption in the insulator, for conducting the excess charge distally from the channel;
    a second interruption in the insulator through which the excess charge escapes; and silicon which resides in the second interruption.

2. The silicon on insulator shaped structure according to claim 1 further comprising a metal line that overlies the gate and is electrically coupled to the body contact.

3. The silicon on insulator shaped structure according to claim 1 wherein the silicon on insulator structure comprises a T-shape.

4. The silicon on insulator shaped structure according to claim 1, further comprising a metal line coupled to the body contact through the silicon in the second interruption.

5. The silicon on insulator shaped structure according to claim 4 further comprising a trench capacitor, that is in communication with at least one of the source or the drain.

6. An integrated circuit comprising:
    a semiconductor substrate;
    a well region formed in the substrate;
    a first oxide layer overlying the substrate;
    a first trench disposed throughout the first oxide layer over the well region;
    a nitride layer overlying the first oxide layer;
    a second oxide layer overlying the nitride layer;
    a second trench disposed throughout the second oxide layer, over the well region and continuous with the first trench, the second trench being wider than the first trench;
    a silicon region extending through the first trench and the second trench, the silicon region electrically contacting the well region and overlying first and second ledge portions of the first oxide layer, an upper surface of the silicon region being substantially co-planar with an upper surface of the second oxide layer;
    a source disposed In the silicon region over the first ledge portion;
    a drain disposed in the silicon region over the second ledge portion;
    a channel disposed in the silicon region between the source and the drain, at least a portion of the channel overlying the first trench; and
    a gate overlying the channel.

7. The circuit of claim 6 wherein all portions of the second oxide layer overlie portions of the first oxide layer.

8. The circuit of claim 6 wherein the silicon region comprises an epitaxially grown silicon region.

9. The circuit according to claim 6, further comprising a contact plug extending through the first oxide layer, the nitride layer and the second oxide layer and contacting the well region.

10. The circuit according to claim 9, wherein the body contact comprises a conductor.

11. The circuit according to claim 10, wherein the conductor comprises a metal layer.

12. The silicon on insulator structure according to claim 9, wherein the contact plug comprises one of the group consisting of N+ and P+ doping.

13. The circuit according to claim 6, further comprising a trench capacitor electrically coupled to the silicon region.

* * * * *

UNITED STATES PATENT AND TRADEMARK OFFICE
CERTIFICATE OF CORRECTION

| | |
|---|---|
| PATENT NO. | : 6,930,357 B2 |
| DATED | : August 16, 2005 |
| INVENTOR(S) | : Kang |

Page 1 of 1

It is certified that error appears in the above-identified patent and that said Letters Patent is hereby corrected as shown below:

Column 5,
Line 55, delete "gown" and insert -- grown --.

Column 6,
Line 40, delete "In" and insert -- in --.

Signed and Sealed this

First Day of November, 2005

JON W. DUDAS
*Director of the United States Patent and Trademark Office*